United States Patent [19]
Katakura

[11] Patent Number: 4,804,904
[45] Date of Patent: Feb. 14, 1989

[54] VOLTAGE TO CURRENT CONVERTERS FOR USE IN AN ACTIVE FILTER AND WITH A MOISE REDUCTION CIRCUIT

[75] Inventor: Masayuki Katakura, Kanagawa, Japan

[73] Assignee: Sony Corporation, Tokyo, Japan

[21] Appl. No.: 121,054

[22] Filed: Nov. 16, 1987

[30] Foreign Application Priority Data

Nov. 21, 1986 [JP] Japan ................................ 61-278402

[51] Int. Cl.$^4$ .............................................. G05F 3/26
[52] U.S. Cl. ................................... 323/312; 307/520; 330/149; 330/252; 381/94
[58] Field of Search ................ 307/520; 330/149, 252, 330/254; 381/94; 323/312, 315, 316

[56] References Cited

U.S. PATENT DOCUMENTS

| | | | |
|---|---|---|---|
| 4,176,323 | 11/1979 | Odell . | |
| 4,290,025 | 9/1981 | Van De Plessche | 330/254 |
| 4,331,929 | 5/1982 | Yokoyama | 330/254 |
| 4,513,242 | 4/1985 | Yokogawa | 381/94 |
| 4,547,741 | 10/1985 | Katakura | 330/149 |
| 4,622,692 | 11/1986 | Cole | 381/94 |

FOREIGN PATENT DOCUMENTS

| | | | |
|---|---|---|---|
| 7709 | 1/1986 | Japan | 330/252 |
| 1201516 | 8/1970 | United Kingdom . | |
| 1267827 | 3/1972 | United Kingdom . | |

Primary Examiner—William H. Beha, Jr.
Attorney, Agent, or Firm—Hill, Van Santen, Steadman & Simpson

[57] ABSTRACT

The invention relates to a voltage to current converter suited for integration. The voltage to current converter combines the outputs of two voltage to current converting circuits whose operating input levels are different from each other so as to prevent the generation of direct current offset voltage. The voltage to current converter is suitable for the construction of a filtering circuit.

7 Claims, 7 Drawing Sheets

VOLTAGE TO CURRENT CONVERTERS FOR USE IN AN ACTIVE FILTER AND WITH A MOISE REDUCTION CIRCUIT

BACKGROUND OF THE INVENTION

1. Field of the Invention

The present invention relates to a voltage to current converter suited for an active filtering circuit.

2. Description of Prior Art

To construct an active filter on an integrated circuit, a voltage to current converter is an important element. FIG. 10 shows an example of an active filter formed on an integrated circuit.

It is difficult to achieve a condenser of a large capacity onto an integrated circuit. Practically, several ten pF is adequate and several thousand pF is the limit even if a portion occupied on a chip area is considerably allowed. For this reason, it is impossible to realize a filter with a low cut-off frequency by increasing the capacity of the condenser. Also, resistances formed on the integrated circuit are diffusion resistances whose values have poor absolute accuracy and large temperature dependence, although the ratio of the resistance values between respective resistances is constant.

Therefore, when an active filter is formed on an integrated circuit, such restriction must be considered fully. An active filter shown in FIG. 10 is made up of in consideration of the above restriction to provide a sufficient accuracy even if the cut-off frequency is low.

In FIG. 10, reference numerals 101 and 102 show PNP type transistors, the emitter of the transistor 101 is connected to one end of a resistance 103, and the emitter of the transistor 102 is connected to one end of a resistance 104. The other end of the resistance 103 and that of the resistance 104 are coupled, and its junction is connected to the collector of a PNP type transistor 105 serving as a current source. A V-I (voltage to current) converting circuit 151 is constructed by the transistors 101, 102 and the resistances 103, 104.

The emitter of a transistor 105 is connected to a power supply terminal 106 of power supply voltage Vcc. The base of the transistor 105 and that of a PNP transistor 107 are commonly connected, and the base of the transistor 107 is connected to the collector of the transistor 107 to form a current-mirror circuit. The emitter of the transistor 107 is connected to the power supply terminal 106, and the collector of the transistor 107 is connected to that of an NPN type transistor 108.

The base of the transistor 108 and that of an NPN type transistor 110 are connected in common, and the base of the transistor 110 is connected to its collector to form a current-mirror circuit. The emitter of the transistor 108 is connected to an earth terminal 109. The emitter of the transistor 110 is connected to the earth terminal 109. The collector of the transistor 110 is connected to one end of a resistance 111. A reference voltage source 112 is connected between the other end of the resistance 111 and the earth terminal 109.

By the reference voltage source 112, a current $2:$ flows into the resistance 111 and the transistor 110. Because the transistors 110 and 108 are current-mirror coupled, the current $2I_{10}$ equal to that flowing into the transistor 110 flows into the transistor 108. Since the transistors 108 and 107 are connected in series, a current equal to that flowing into the transistor 108 flows into the transistor 107, and the current $2I_{10}$ current-mirror coupled to the transistor 107 flows into the transistor 105. As a result, the transistor 105 operates as a constant current source having the current value $2I_{10}$. The base of the transistor 101 is connected to an input terminal 113. The base of the transistor 102 is connected to an output terminal 133. The collector of the transistor 101 is connected to the anode of a diode 114 and to the base of an NPN type transistor 121. The collector of the transistor 102 is connected to the anode of a diode 115 and to the base of an NPN type transistor 122. The cathodes of the diodes 114 and 115 are coupled to the anode of a diode 116. The cathode of the diode 116 is coupled to the earth terminal 109.

A multiplier 152 is composed of the diodes 114, 115 and the transistors 121, 122.

The emitters of the transistors 121 and 122 are commonly coupled, and its junction is connected to the collector of a transistor 123 acting as a current source. The emitter of the transistor 123 is connected to the earth terminal 109. The base of the transistor 123 is commonly coupled to the base of a transistor 124 and that of a transistor 125, and the base of the transistor 125 is coupled to its collector to form a current-mirror circuit. A terminal 130 is led from the collector of the transistor 125. On the other hand, a terminal 131 is derived from the junction of the reference voltage source 112 and the resistance 111. A resistance 132 is externally provided between the terminals 130 and 131.

By the reference voltage source 112, a current $I_{11}$ flows into the externally provided resistance 132 and the transistor 125. Since the transistors 125 and 123 are current-mirror coupled, the constant current $2I_{11}$ flows into the transistor 123.

The collector of the transistor 121 is connected to that of a PNP type transistor 126 and to the base of an NPN type transistor 128. The emitter of the transistor 126 is coupled to the power supply terminal 106. The collector of the transistor 122 is connected to the collector of a PNP type transistor 127. The base of the transistor 127 is commonly connected to that of the transistor 126, and the base of the transistor 127 is connected to its collector to form a current-mirror circuit. The emitter of the transistor 127 is connected to the power supply terminal 106.

A condenser 129 is connected between the junction of the collector 121 and the base of the transistor 128 and the earth terminal 109. The collector of the transistor 128 is connected to the power supply terminal 106. The emitter of the transistor 128 is connected to the collector of the transistor 124, and an output terminal 133 is led from the emitter of the transistor 128. The emitter of the transistor 124 is connected to the earth terminal 109. The bases of the transistors 124 and 125 are commonly connected to form a current-mirror circuit. The transistor 124 operates serving as a current source for the emitter-follower transistor 128.

An operation of the above-mentioned active filtering circuit will be described.

An input signal from the input terminal 113 is supplied to the base of the transistor 101 of the V-I converting circuit 151. The output signal of the emitter-follower transistor 128 is fed back to the base of the transistor 102. The differential output of the V-I converting circuit 151 is given to the multiplier 152. The output of the multiplier 152 is converted into a single-end output by the current-mirror circuit composed of the PNP type transistors 126 and 127 and given to the condenser 129. A signal obtained from terminal voltage of the condenser 129 is taken out from the output terminal 133 through the emitter-follower transistor 128.

Assuming that an input signal supplied to the input terminal 113 and an output signal produced from the output terminal 133 are $v_{in}$ and $v_{out}$, respectively, the emitter voltage of the transistor 101 becomes $(v_{in}+V_{BE})$, and the emitter voltage of the transistor 102 takes $(v_{out}+V_{BE})$. As a result, assuming that the resistance values of the resistances 103 and 104 are $R_e$, respectively, a current $((v_{in}-v_{out})/(2.Re))$ flows through the resistances 103 and 104. Output currents $i_{11}$ and $i_{12}$ of the V-I converting circuit 151 are obtained approximately by the following equations on the assumption that the current $2I_{10}$ flows into the transistor 105:

$$i_{11} = I_{10} - (v_{in} - v_{out})/(2.R_e) \tag{51}$$

$$i_{12} = I_{10} + (v_{in} - v_{out})/(2.R_e) \tag{52}$$

Assuming that the current $I_{11}$ flows into the transistor 123, it is known that output currents $i_{13}$ and $i_{14}$ of the multiplier 152 become as follows:

$$i_{13} = I_{11} - (I_{11}/I_{10}) \cdot (v_{in} - v_{out})/(2.R_e) \tag{53}$$

$$i_{14} = I_{11} + (I_{11}/I_{10}) \cdot (v_{in} - v_{out})/(2.R_e) \tag{54}$$

Therefore, a charge current $i_c$ for the condenser 129 is given as:

$$i_c = i_{14} - i_{13} = (I_{11}/I_{10}) \cdot (v_{in} - v_{out})/R_e \tag{55}$$

Now, assuming that $(I_{11}/I_{10})/R_e$ is a transfer conductance Gm, Equation (55) can be expressed by:

$$i_c = Gm\ (v_{in} - v_{out}) \tag{56}$$

Now, the input voltage $v_{in}$, the output voltage $v_{out}$ and the current $i_c$ are instant values, respectively. However, to obtain the transfer function of this circuit by defining $V_{in}(s)$, $V_{out}(s)$ and $I_c(s)$, respectively, as the function of $s(=j\omega)$, $$I_c(s) = Gm(V_{in}(s) - V_{out}(s)) \tag{57}$$

is established. Also, assuming that the electrostatic capacity of the condenser 129 is $C_o$, $$V_{out}(s) = I_c(s)/(s\ C_o) \tag{58}$$

is established.

Therefore, by obtaining $V_{out}(s)$ from Equations (57) and (58), $$V_{out}(s) = \frac{V_{in}(s)}{1 + sC_o/Gm} \tag{59}$$

is obtained. From the above equation, it is indicated that this circuit exhibits a first-order low-pass filtering characteristic.

The cut-off frequency of this circuit is defined by the electrostatic capacity of the condenser 129 and the transfer conductance Gm. In an integrated circuit, a considerably accurate and less temperature-dependent capacity can be realized by the use of an insulating film such as a nitride film, for example. Consequently, if a correct transfer conductance can be realized, a correct filtering characteristic can be provided.

The transfer conductance Gm is defined as mentioned above by:

$$Gm = (I_{11}/I_{10})/R_e \tag{60}$$

Here, the current ratio $(I_{11}/I_{10})$ is defined by the internal resistance 111 and the externally provided resistance 132 rather than a reference voltage source 112. Assuming that the resistance values of the resistances 111 and 132 are $R_{111}$ and $R_{132}$, respectively, since $$I_{11}/I_{10} = R_{111}/R_{132} \tag{61}$$

the transfer conductance Gm is given as:

$$Gm = R_{111} \cdot R_e/R_{132} \tag{62}$$

Now, since the resistance values $R_{111}$ and $R_e$ are diffusion resistances formed in the integrated circuit, the absolute accuracy is inferior but the resistance ratio can be kept constant. Assuming that the resistance ratio of the resistances $R_{111}$ and $R_e$ is N, $$Gm = N/R_{132} \tag{63}$$

is established.

As a result, the transfer conductance does not depend on the absolute accuracy of the resistances, thereby to provide an accurate transfer conductance as well as to achieve a filtering circuit with a correct cut-off frequency.

In this way, the above-mentioned active filtering circuit is capable of providing an accurate characteristic, since the cut-off frequency does not depend on the absolute values of the resistances on the integrated circuit and is defined by the relative ratio of the resistances on the integrated circuit and the externally provided resistance. In addition, by increasing the resistance value $R_{132}$ of the resistance 132 and decreasing the resistance ratio N, a low cut-off frequency can be obtained without making the capacity of the condenser extremely large.

However, in the above-described active filtering circuit, offset voltage $\Delta V_o$ as equivalently shown at a voltage source 161 between the collector of the transistor 101 and the anode of the diode 114 in FIG. 10 due to mismatching in respective saturation currents of the diode pair consisting of the diodes 114, 115, the transistor pair consisting of the transistors 121, 122 and the transistor pair consisting of the transistors 126, 127; respective Allee's effects of the transistor pair consisting of the transistors 121, 122 and the transistors 126, 127 constituting the current-mirror circuit; and respective current amplification gains of the transistors 126, 127 forming the current-mirror circuit and the emitter follower transistor 128. By the offset voltage $\Delta V_o$ thus generated, offset voltage $V_{off}$ is generated at the output terminal 133. This offset voltage $V_{off}$ is represented approximately by the following equation:

$$V_{off} = 2\ R_e\ I_{10} \frac{1 - \exp(\Delta V_o/V_T)}{1 + \exp(\Delta V_o/V_T)} \tag{64}$$

where $V_T$ is thermal voltage kT/q (k: Boltzmann constant, T: absolute temperature, q: elementary electric charge) and has a value of 26 mV at a normal temperature. If $\Delta V_o << V_T$ is established, Equation (64) is given as:

$$V_{off} \approx R_e I_{10} \Delta V_o / V_T \quad (65)$$

Now, on the assumption of $R_e = 10$ K$\Omega$, $I_{10} = 100$ $\mu$A and $\Delta V_o = 3$ mV, for instance, the offset voltage $V_{off}$ is about 120 mV. The maximum value of signal levels, which can be dealt with this circuit, is restricted by the restance value $R_e$ of the resistances 103 and 104 and the current value $I_{10}$, and $4 R_e \cdot I_{10}$ is the maximum value of the signal levels to be handled in terms of peak to peak value. Therefore, in this case, it is $4 V_{p-p}$. In this manner, if the voltage $\Delta V_o$ is determined with respect to the maximum value of the signal levels to be handled in this circuit, the offset voltage $V_{off}$ is produced at a constant rate.

Such generation of the offset voltage $V_{off}$ does not pose a serious problem, since an input signal is supplied through a coupling condenser in a filtering circuit using for suppression of spurious components, for example. However, there is a case where such offset voltage $V_{off}$ becomes a great problem. An example in which the offset voltage $V_{off}$ brings about a big problem will be described specifically hereunder.

FIG. 11 shows an encoding circuit of an autio-noise reduction circuit for a compact cassette tape recorder. An audio signal recorded through the encoding circuit shown in FIG. 11 is reproduced into an original voice signal by a decoding circuit having a symmetrical characteristic with this circuit.

In FIG. 11, reference numeral 201 indicates an input terminal. An input signal from the input terminal 201 is supplied to a variable high-pass filter 202 and an adder 205. The output of the adder 205 is taken out from an output terminal 206. In the variable high-pass filter 202, its cut-off frequency varies by control voltage from a level detector 204 and the cut-off frequency increases with the increase of a signal level. The output of the variable high-pass filter 202 is supplied to the adder 205 and a high-frequency region weighting circuit 203. The output weighting circuit 203 is given to the level detector 204.

In the absence of a signal, the cut-off frequency of the variable high-pass filter 202 is in the lowest state. By the adder 205, the input signal and the signal passing the variable high-pass filter 202 are added so that the gains in the middle and high frequency regions are raised by approximately 10 dB. On the other hand, the middle and high frequency regions elevated at the time of recording is attenuated by about 10 dB in a decoding circuit on the reproduction side. As a result, noises in the middle and high frequency regions are attenuated by approximately 10 dB. With the increase of the signal level, the cut-off frequency of the variable high-pass filter 202 is raised and the frequency characteristic of the circuit approaches a flat state. Since the decoding circuit on the reproduction side approaches a flat state, a noise reduction effect decreases. However, in this state, no noise is sensed because a masking effect by the signal works.

The high-frequency region weighting circuit 203 is a filtering circuit and acts to increase the cut-off frequency of the variable high-pass filter 202 when an input frequency increases. This circuit prevents the frequency characteristic in the middle and high level regions from being elevated in the high frequency region to provide a flat characteristic or the one with a slightly lowered high-frequency region.

In the case where the above-mentioned enoding circuit for the audio-noise reduction circuit is realized in an integrated circuit together with the high-frequency region weighting circuit 203, the generation of the offset voltage $V_{off}$ will become a serious problem. Clearly, in FIG. 11, the level detector 204 must correctly detect signal levels extending over a considerably broad range. With the offset voltage $V_{off}$ generated, an error may occur in the control voltage given from the level detector 204. Although it is conceived that a coupling condenser is inserted between the high-frequency region weighting circuit 203 and the level detector 204, this may bring about the increase of pins led from a package, since an externally provided condenser becomes necessary.

An object of the invention is, therefore, to a voltage to current converter capable of constructing an active filtering circuit free from the generation of offset voltage and having an accurate direct current transmission characteristic.

SUMMARY OF THE INVENTION

The invention relates to a voltage to current converting circuit particularly suitable for the construction of an active filter.

In the converting circuit, two V-I converting circuits are provided at the first stage. One V-I converting circuit operates at a negative level of an input signal, whereas the other V-I converting circuit operates at a positive level of the input signal. These are combined to produce a voltage to current conversion output. Consequently, no direct current is generated to improve a direct current transfer characteristic.

BRIEF DESCRIPTION OF THE DRAWINGS

The invention will be apparent from the following detailed description when taken in conjunction with the accompanying drawings, in which.

DETAILED DESCRIPTION OF THE INVENTION

Figure 1:
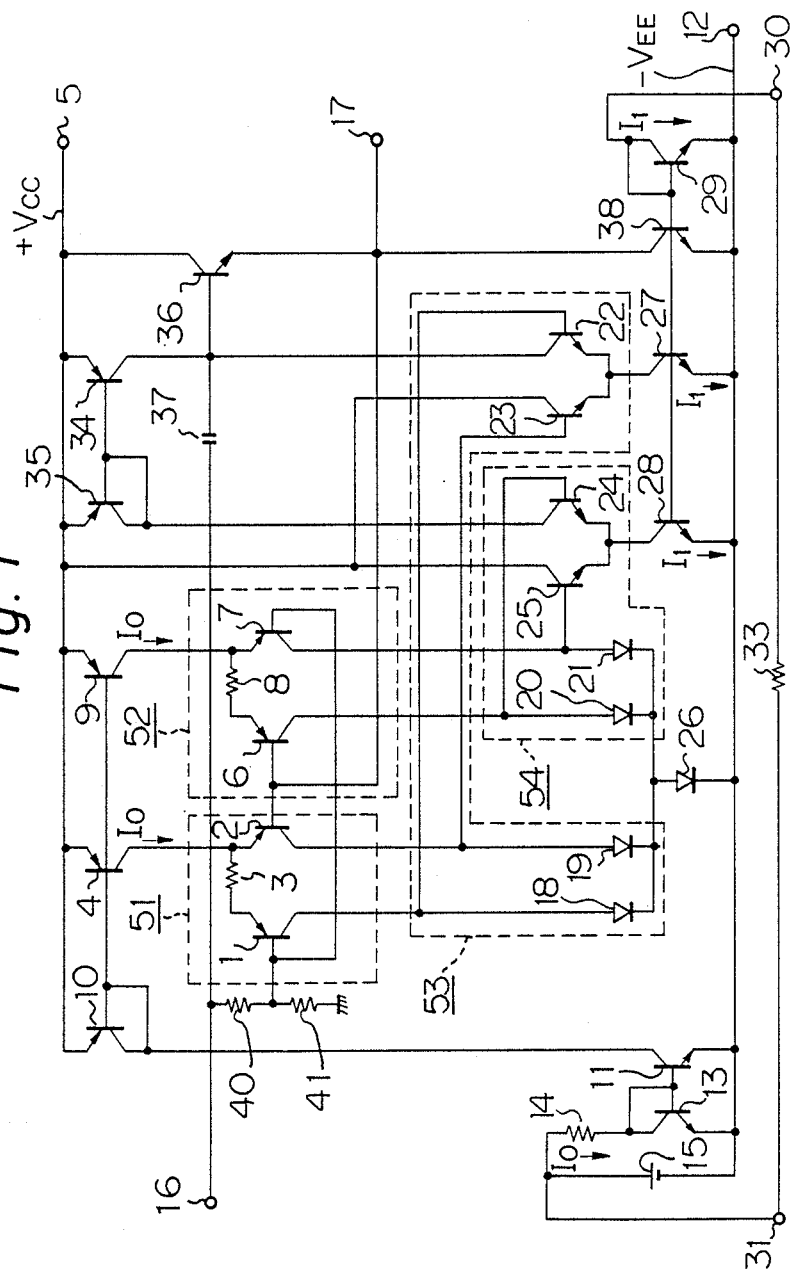
FIG. 1 is a connection diagram of an embodiment of the invention.

An embodiment of the invention will be described in the following order:

a. Structure of one embodiment
b. Description of operation
c. Means for preventing a crossover distortion
a. Structure of one embodiment In FIG. 1, the emitters of PNP type transistors 1 and 2 are connected to each other through a resistance 3.

The emitter of the transistor 2 is connected to the collector of a PNP type transistor 4 serving as a current source. The emitter of the transistor 4 is coupled to a power supply terminal 5 of $+V_{cc}$.

The emitters of PNP type transistors 6 and 7 are connected to each other through a resistance 8. The emitter of the transistor 7 is connected to the collector of a PNP type transistor 9 as a current source. The emitter of the transistor 9 is connected to the power supply terminal 5.

The bases of the transistors 4 and 9 are commonly coupled to the base of a PNP type transistor 10, and the base and the collector of the transistor 10 are coupled to form a current-mirrow circuit. The emitter of the transistor 10 is connected to the power supply terminal 5. The collector of the transistor 10 is coupled to the collector of an NPN type transistor 11.

The emitter of the transistor 11 is connected to a power supply terminal 12 of $-V_{EE}$. The bases of the transistor 11 and an NPN type transistor 13 are commonly coupled, and the base of the transistor 13 and its collector are connected to form a current-mirror circuit. The emitter of the transistor 13 is connected to the power supply terminal 12. The collector of the transistor 13 is connected to one end of a resistance 14. A reference voltage source 15 is connected between the other end of the resistance 14 and the power supply terminal 12.

By the reference voltage source 15, a current $I_o$ flows into the transistor 13 via the resistance 14. Since the transistors 13 and 11 are current-mirror coupled, the current $I_o$ equal to that flowing into the transistor 13 flows into the transistor 11, and the same current $I_o$ flows into the transistor 10 serially connected to the transistor 11. As a result, the current $I_o$ equal to that flowing into the transistor 10 flows into the current-mirror coupled transistors 4 and 9.

The base of the transistor 1 is connected to the base of the transistor 7, and its junction is connected to the junction of serial connection of resistance 40 and 41 provided between an input terminal 16 and the earth. The base of the transistor 2 is connected to that of the transistor 6 and its junction is connected to an output terminal 17. A first V-I converting circuit 51 is constructed by the transistors 1 and 2 and the resistance 3. A second V-I converting circuit 52 is constructed by the transistors 6 and 7 and the resistance 8.

The collector of the transistor 1 is connected to the anode of a diode 18 and to the base of an NPN type transistor 22. The collector of the transistor 2 is connected to the anode of a diode 19 and to the base of an NPN type transistor 23. The collector of the transistor 6 is connected to the anode of a diode 20 and to the base of an NPN type transistor 24. The collector of the transistor 7 is connected to the anode of the diode 21 and to the base of an NPN type transistor 25. The cathodes of the diodes 18 to 21 are coupled to the anode of a diode 26 and the cathode of the diode 26 is coupled to the power supply terminal 12.

The emitters of the transistors 22 and 23 are commonly connected and its junction is connected to the collector of an NPN type transistor 27 serving as a current source. The emitters of the transistors 24 and 25 are commonly coupled, and its junction is connected to the collector of an NPN type transistor 28 acting as a current source.

A first multiplier 53 is made up of the diodes 18, 19 and the transistors 22, 23. A second multiplier 54 is composed of the diodes 20, 21 and the transistors 24, 25.

The base of the transistor 27 and the base of the transistor 28 are commonly coupled to the base of an NPN type transistor 29, and the base of the transistor 29 and its collector are connected to form a current-mirror circuit. The emitters of the transistors 28, 29 are connected to the power supply terminal 12. A terminal 30 is led from the collector of the transistor 29. A terminal 31 is derived from the junction of the reference voltage source 15 and the resistance 14 and a resistance 33 is externally between the terminals 30 and 31.

By the reference voltage source 15, a current flows into the resistance 33, and this current $I_1$ flows into the transistor 29. Since the transistors 27 and 28 are current-mirror coupled to the transistor 29, the current equal to the current $I_1$ flowing into the transistor 29 flows into the transistors 27 and 28.

The collector of the transistor 22 is connected to the collector of a PNP type transistor 34, and its junction is connected to the base of an NPN type transistor 36 and to one end of a condenser 37. The other end of the condenser 37 is connected to the input terminal 16. The collector of the transistor 23 and that of the transistor 25 are connected to the power supply terminal 5. The collector of the transistor 24 is connected to that of the transistor 35. The base of the transistor 35 is connected to that of transistor 34. The collector of the transistor 35 is coupled to the base of the transistor 35 to form a current-mirror circuit. The emitters of the transistors 34 and 35 are coupled to the power supply terminal 5.

The collector of the transistor 36 is coupled to the power supply terminal 5. The emitter of the transistor 36 is connected to the collector of the transistor 38 serving as a current source. The base of the transistor 38 and that of the transistor 29 are connected commonly. The emitter of the transistor 38 is connected to the power supply terminal 12.

b. Description of Operation

The embodiment functions as a high-frequency region weighting circuit of an audio-noise reduction circuit. An operation of this embodiment will be described.

Since the reactance of the condenser 37 becomes lowered for the high frequency region, high frequency components of the input signal from the input terminal 16 are taken out as they are from the output terminal 17 via the condenser 37 and the emitter-follower transistor 36. Its low frequency components are voltage-divided between resistances 40 and 41 and supplied to the V-I converting circuits 51 and 52. As will be described later, the V-I converting circuit 51 operates when the level of the input signal supplied to the input terminal 16 is negative, while the V-I converting circuit 52 operates when the input signal given to the input terminal 16 is positive. The output of the V-I converting circuit 51 is fed to the multiplier 53, while the output of the V-I converting circuit 52 is given to the multiplier 54. The outputs of the multipliers 53 and 54 are converted into a single end output by the current-mirror circuit consisting of the transistors 34 and 35 and taken out from the output terminal 17 through the emitter follower transistor 36.

As a result, this embodiment provides the gain of 1 for the high frequency region and the gain of ($R_{41}/R_{40}+R_{41}$) to exhibit a characteristic with the high frequency region elevated on the assumption that the resistances 40 and 41 have resistance values $R_{40}$ and $R_{41}$.

Figure 2:
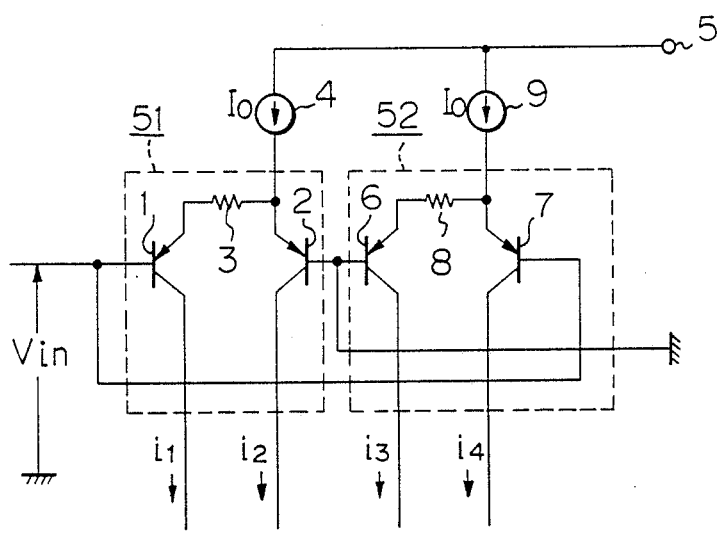
FIG. 2 is a connection diagram for describing one embodiment of the invention.

The V-I converting circuits 51 and 52 in the embodiment are described. As shown in FIG. 2, the two V-I converting circuits 51 an 52 are employed. In the V-I converting circuit 51, the transistor 4 operating as a constant current source is connected to the emitter of the transistor 2 but no constant current source is connected to the emitter of the transistor 1. Also, in the V-I converting circuit 52, the transistor 9 operating as a constant current source is connected to the emitter of the transistor 7 but no constant current source is coupled to the emitter of the transistor 6.

Consequently, in the V-I converting circuit 51, when the base voltage of the transistor 1 is higher than that of the transistor 2, the transistor 1 is cut off, whereas the base voltage of the transistor 1 is lower than that of the transistor 2, a current flows into the transistor 1 depending on an input signal voltage. In the V-I converting circuit 52, the base voltage of the transistor 6 is higher than that of the transistor 7, the transistor 6 is cut off, while the base voltage of the transistor 6 is lower than that of the transistor 7, a current flows into the transistor 6 depending on the input signal voltage.

Figure 3:
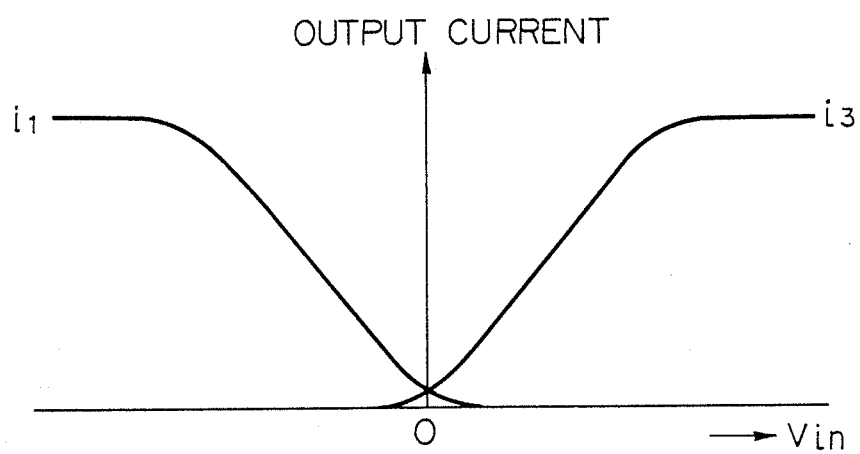
FIGS. 3 and 4 are graphs describing the embodiment of the invention.

Therefore, when an input signal $v_{in}$ is supplied to the bases of the transistors 1 and 7 and when the bases of the transistors 2 and 7 are kept at zero potential, the V-I converting circuit 51 operates with the input signal $v_{in}$ of a negative level so that a V-I conversion output current is produced by the current $i_1$ of the transistor 1. By the input signal $v_{in}$ of a positive level, the V-I converting circuit 52 operates so that a V-I conversion output current is produced by the current $i_3$ of the transistor 6. Namely, FIG. 3 shows a relationship between the input signal $v_{in}$ and the current $i_1$ flowing into the transistor 1 and the current $i_3$ flowing into the transistor 6. As the input signal $v_{in}$ increases, the current $i_1$ decreases. When the input signal $v_{in}$ becomes almost OV, the current $i_1$ assumes 0. When the input signal $v_{in}$ is higher than OV, the current $i_3$ increases.

In this way, by the use of the two V-I converting circuits 51 and 52, the V-I converting circuit 51 operates when the input signal $v_{in}$ is negative, while the V-I converting circuit 52 operates when the input signal $v_{in}$ is positive. As a result, no offset voltage $V_{off}$ appears at the output terminal 17 even if there is offset voltage $\Delta V_o$ due to mismatching etc. in respective saturation currents of the diode pairs of the diodes 18, 19 and the diodes 20, 21 and the transistor pairs of the transistors 22, 23 and the transistors 24, 25. This is because the multipliers 53 and 54 are almost cut off in the absence of a signal.

c. Means for preventing a crossover distortion

In the case where the voltage to current conversion is performed using such two V-I converting circuits 51 and 52, two voltage-current conversion outputs must be linearly linked in the vicinity of the cut-off so as not to cause the so-called crossover distortion. Requisite conditions for this will be described.

Figure 4:
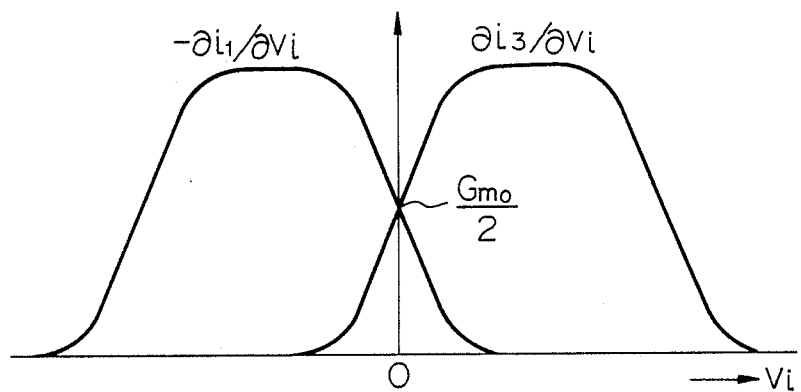

FIG. 4 shows the currents $i_1$ and $i_3$ of FIG. 3 subjected to the differential with respect to the input signal $v_{in}$ and indicates inclinations of the currents $i_1$ and $i_3$ of FIG. 3 for the input signal $v_{in}$, i.e., transfer conductances. The conditions under which the two V-I converting circuits 51 and 52 are linearly linked without causing the crossover distortion are that one half of the maximum value $Gm_o$ of the transfer conductance of each V-I converting circuit is taken in the state of $v_{in}=0$.

Figure 5:
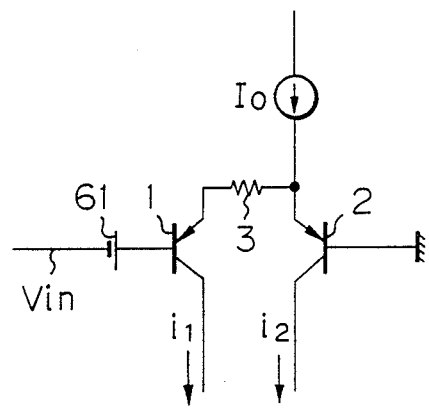
FIG. 5 is a connection diagram for describing an improvement of a crossover distortion.

FIG. 5 shows a diagram of one of the V-I converting circuits 51 and 52 of FIG. 2. In FIG. 51, reference numeral 61 indicates offset voltage $\Delta V$ provided for the prevention of the generation of the crossover distortion. The method of that generation will be described later.

First, the maximum value $Gm_o$ of the transfer conductance of the V-I converting circuit will be calculated. The transfer conductance takes the maximum value under the condition of $i_1=i_2=I_o/2$ to have the following value:

$$Gm_o = \frac{1}{R_E + 4 \cdot V_T/I_o} \quad (1)$$

where $R_E$ are resistance values of the resistances 3 and 8 and $V_T$ is (kT/q).

Next, in response to the input signal $v_{in}=0$, $i_1=\Delta$ and $i_2 \approx I_o$ are established. Assuming that the transfer conductance at this time is $Gm_c$, $$Gm_c = \frac{1}{R_E + V_T/\Delta_i + V_T/I_o} \quad (2)$$

is established.

Since the condition under which the crossover distortion becomes almost minimal is when $2 \cdot Gm_c = Gm_o$ is established, the following equation is established:

$$2(R_E + 4 \cdot V_T/I_o) = R_E + V_T/\Delta_i + V_T/I_o \quad (3)$$

By solving this on $\Delta_i$, the following equation is established:

$$\Delta_i = \frac{V_T}{R_E}\left(\frac{1}{1 + 7\,V_T/(I_o \cdot R_E)}\right) \quad (4)$$

Next, when the characteristics, that is, saturation currents of the two transistors constructing the V-I converting circuit 51 are identical, $\Delta V$ for satisfying Equation (4) is calculated.

$$\begin{aligned}
\Delta V &= V_{BE} - R_E \Delta_i - V_{BE} \quad (5)\\
&= V_T \ln\left(\frac{I_o}{I_s}\right) - R_E \Delta_i - V_T \ln\left(\frac{\Delta_i}{I_s}\right)\\
&= V_T \ln\left(\frac{I_o}{\Delta_i}\right) - R_E \cdot \Delta_i
\end{aligned}$$

By putting Equation (4) into Equation (5), $$\Delta V = V_T \ln\left(\frac{R_E \cdot I_o(1 + 7\,V_T/(I_o \cdot R_E))}{V_T}\right) - \quad (6)$$

$$R_E \cdot \frac{V_T}{R_E}\left(\frac{1}{1/1 + 7\,V_T/(I_o \cdot R_E)}\right)$$

Assuming now that $(I_o \cdot R_E)/V = m$ is established, $$\Delta V = V_T \ln(m(1 + 7/m)) - V_T\left(\frac{1}{1 + 7/m}\right) \quad (7)$$

$$= V_T\left(\ln(m) + \ln(1 + 7/m) - \frac{1}{1 + 7/m}\right)$$

is obtained.

Figure 6:
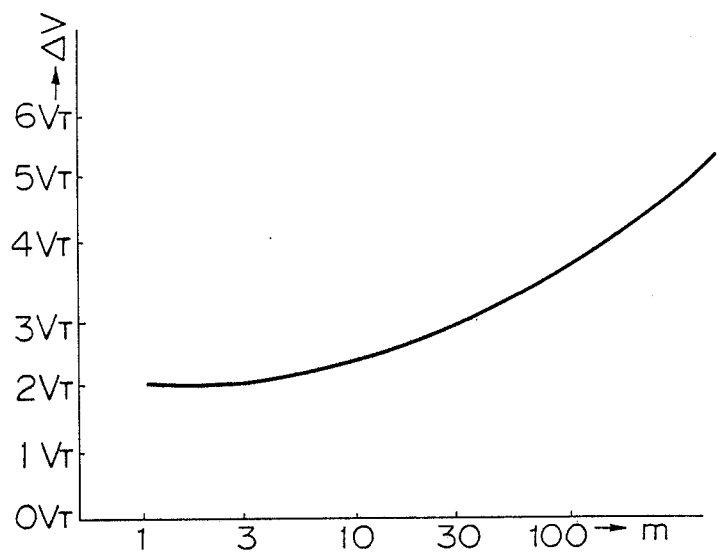
FIGS. 6 and 7 are graphs for describing the improvement of the crossover distortion.

FIG. 6 shows a relationship between m and $\Delta V$ obtained from Equation (7). In FIG. 6, a horizontal axis indicates m, while a vertical axis indicates $\Delta V$. Since the condition under which the above-mentioned crossover distortion becomes minimal is based on the assumption of $\Delta_i < < I_o$, $\Delta V$ is not correct in the region where m is equal to or less than 10. Because m is usually selected to be equal to or larger than 20 at least in order to fully reduce a non-linear distortion in the circuit and to fully secure a dynamic range, this condition is satisfied. Also, in the strict meaning, what is obtained by Equation (7) is a rough value indicative of the condition of the minimum crossover distortion, not the optimum value.

Figure 7:
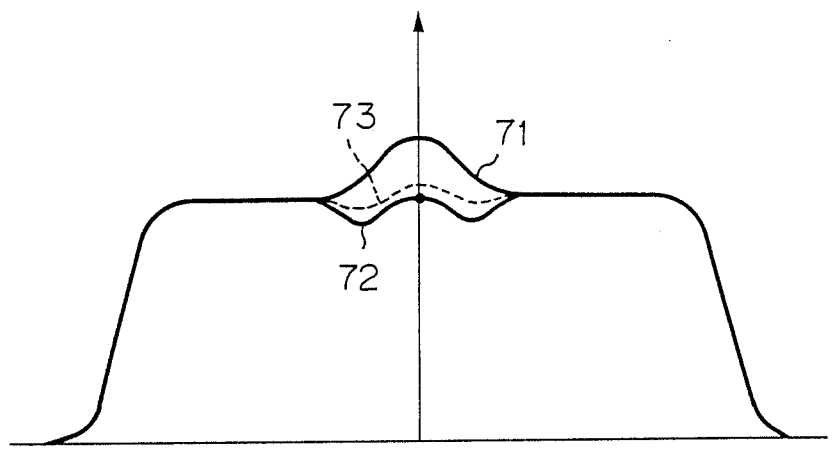

In detail, FIG. 7 shows how a crossover distortion is eliminated depending on $\Delta V$. In FIG. 7, reference numeral 71 shows a change of the transfer conductance at the time of $\Delta V = 0$ and shows that a large projection is seen in the vicinity of $v_{in}=0$ to indicate the remarkable generation of the crossover distortion. Meanwhile, reference numeral 72 shows a change of the transfer conductance in the case where $\Delta V$ obtained from Equation (7) is given. Although the crossover distortion is considerably reduced, the transfer conductance slightly decreases in the left- and right- handed portions of $v_{in}=0$. Reference numeral 73 indicates a characteristic of the transfer conductance in the case where $\Delta V$, which is the condition of the minimum crossover distortion, is given, and this corresponds to that the offset voltage slightly smaller than $\Delta V$ obtained from Equation (7) is given. This case means that the crossover distortion decreases when the transfer conductance in the state of $v_{in}=0$ is set to be slightly large as compared with the maximum value ($Gm_o$) of the transfer conductance in the region (in the linear range) where $v_{in}$ is fully large. It is difficult to obtain $\Delta V$ at this time through analysis. Therefore, a rough value is obtained by Equation (7) and the optimum value can be obtained on the basis of the rough value through numerical analysis.

Figure 8:
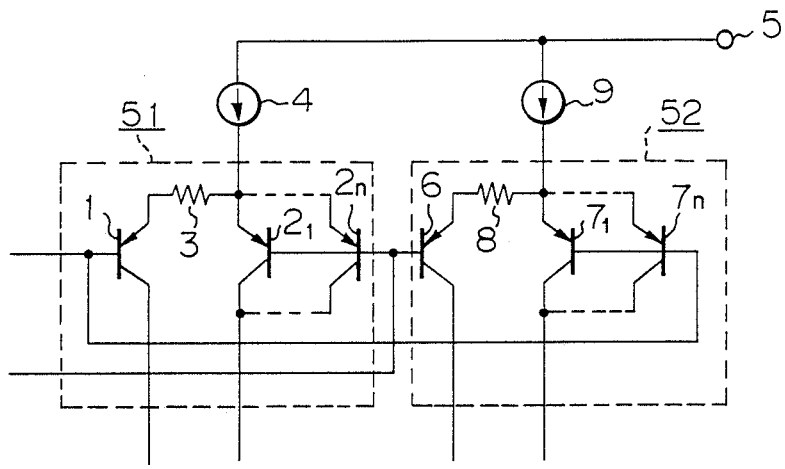
FIG. 8 is a connection diagram for showing an example of means for improving the crossover distortion.
Figure 11:
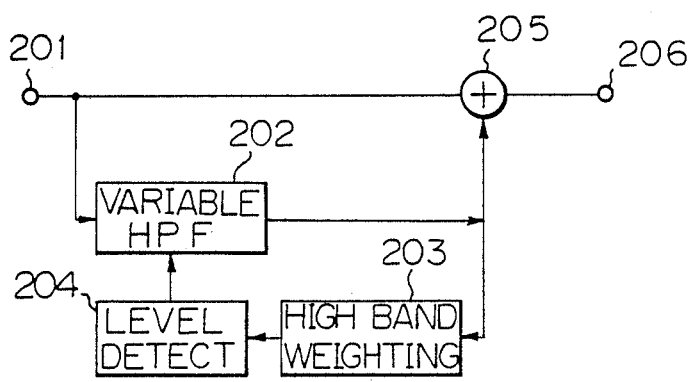
FIG. 11 is a block diagram of an example of an encoding circuit for an audio-noise reduction circuit.

Specific generating means for the $\Delta V$ will be described. FIG. 8 shows an example of the specific generating means of $\Delta V$. In FIG. 8, n transistors $2_1$ to $2_n$ connected in parallel are employed as the transistor 2 constituting the V-I converting circuit 51. n transistor $7_1$ to $7_n$ connected in parallel are used as the transistor 7 constituting the V-I converting circuit 52. By the use of parallel connection of plural transistors into one of the transistors, which construct each of the V-I converting circuits 51 and 52, $\Delta V$, which is defined by:

$$\Delta V = V_T \ln(n)$$

can be generated.

There is a feature that the $\Delta V$ generating means is very simple. However, there is a disadvantage that the number of the transistors connected in parallel increases particularly when the dynamic ranges of the V-I converting circuits 51 and 52 are kept large. For instance, about 20 transistors must be connected in parallel to satisfy Equation (7) in the case of $m=40$ corresponding to the dynamic range of $2 V_{p-p}$.

Figure 9:
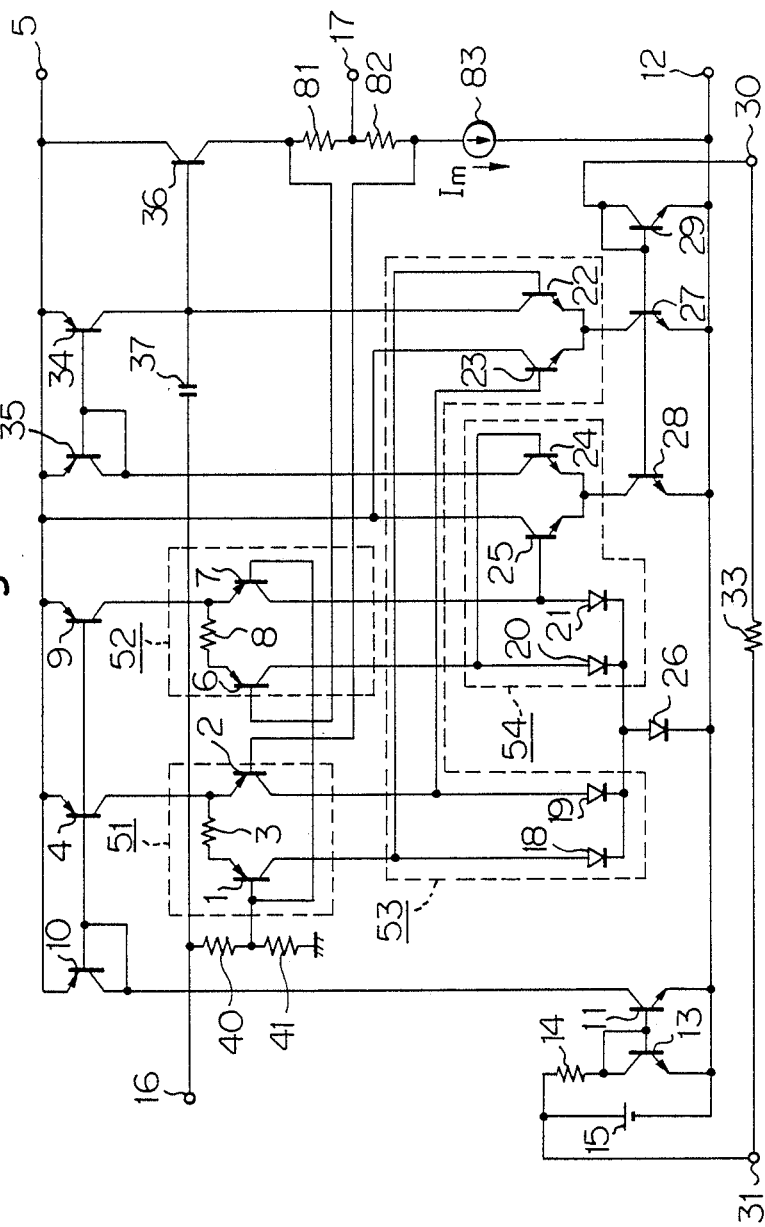
FIG. 9 is a connection diagram for showing another example of means for improving the crossover distortion.
Figure 10:
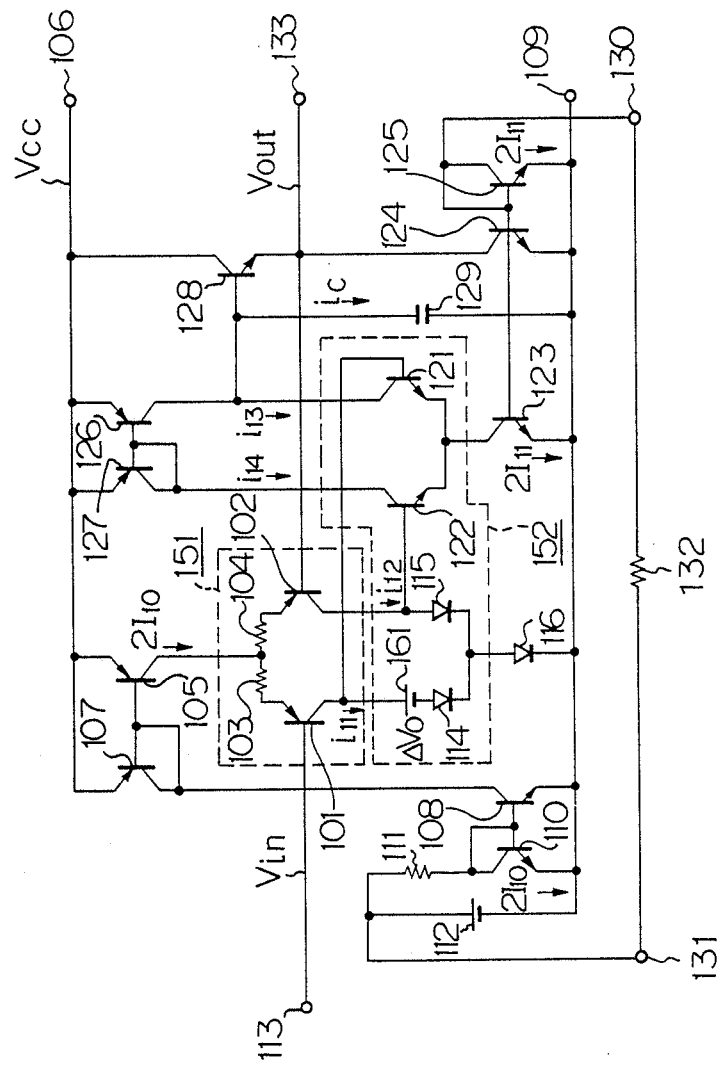
FIG. 10 is a connection diagram of one example of an active filtering circuit using a conventional voltage to current converter.

FIG. 9 shows another example of the $\Delta V$ generating means. This example is effective particularly when m is large. In FIG. 9, serial connection of resistances 81 and 82 is made between the emitter of an emitter-follower transistor 36 and a current source 83 and the junction of the resistances 81 and 82 is connected to the output terminal 17. The base of the transistor 2 is connected to the junction of the resistance 82 and the current source 83. The base of the transistor 6 is connected to the junction of the emitter of the transistor 36 and the resistance 81.

Assuming that the current value of the current source 83 and the resistance values of the resistances 81 and 82 are $I_m$ and $R_m$, respectively, the voltage applied to each base of the transistors 2 and 7 is dropped by $\Delta V = I_m \cdot R_m$.

In such a manner, when $\Delta V$ is developed by providing the resistances 81 and 82 at the emitter-follower transistor 36, there is a need to highten an input impedance of a circuit connected to the output terminal 17. In addition, it is desirable that the current value of the current source 83 is proportional to thermal voltage $V_T$.

It is to be noted that various means is conceivable besides this. Needless to say, a voltage source may be connected to the bases of the transistors 1 and 6.

As has been described before, in the V-I converting circuits 51 and 52 used in one embodiment of the invention, the V-I converting circuit 51 operates when the input signal is negative, while the V-I converting circuit 52 operates when the input signal $v_{in}$ is positive. Consequently, no offset voltage $V_{off}$ appears at the output terminal 17 even if there is offset voltage $\Delta V_o$ due to mismatching in the respective saturation currents of the diode pairs consisting of the diodes 18, 19 and the diodes 20, 21 and the transistor pairs consisting of the transistors 22, 23 and the transistors 24, 25. This is because the multipliers 53 and 54 are almost cut off in the absence of a signal.

The crossover distortion can be eliminated by applying adequate voltage $\Delta V$ to the bases of the transistors 1 and 6.

According to the invention, the two V-I converting circuits 51 and 52 are provided. One V-I converting circuit 51 operates in response to an input signal of a negative level, while the other V-I converting circuit 52 is responsive to the input signal of a positive level. In the absence of the input signal, the multipliers 53 and 54 are cut off so that no offset voltage $V_{off}$ appears at the output terminal 17. Consequently, an active filter having a correct direct-current transfer characteristic can be achieved.

What is claimed is:

1. A voltage to current converter, comprising:
    a first voltage to current converting circuit responsive to a positive input level and having a first pair of outputs;
    a second voltage to current converting circuit responsive to a negative input level and having a second pair of outputs;
    an input section for said two voltage to current converting circuits;
    a first multiplier including a first pair of diodes, each of which is respectively supplied with one of said first outputs and a first pair of emitter-common differential transistors whose base electrodes are respectively given a potential difference between said first pair of diodes;

a second multiplier including a second pair of diodes, each of which is respectively supplied with one of said second outputs, and a second pair of emitter-common differential transistors whose base electrodes are respectively given a potential difference between said second pair of diodes; and means for detecting output currents of said first and second multipliers.

2. A noise reduction circuit, comprising:

a variable high-pass filter responsive to an input signal;

an adder for adding an output of the filter and said input signal;

a high-frequency weighting circuit responsive to said output of said filter; and a level detector for detecting an output of the weighting circuit and producing an output to said filter, said variable high-pass filter including a voltage to current converter, which comprises:

a first pair of differential transistors having first and second transistors whose emitter electrodes are connected to each other through a feedback resistance;

a second pair of differential transistors having third and fourth transistors whose emitter electrodes are connected to each other through a feedback resistance;

a first current source connected to the emitter electrode of said second transistor and a second current source connected to the emitter electrode of said fourth transistor;

a first multiplier including a first pair of diodes which are respectively supplied with collector currents of the first pair of differential transistors and a first pair of emitter-common differential transistors whose base electrodes are respectively given a potential difference of said first pair of diodes;

a second multiplier including a second pair of diodes which are respectively supplied with collector currents of said second pair of differential transistors and a second pair of emitter-common differential transistors whose base electrodes are respectively given a potential difference of the second pair of diodes;

a current-mirror circuit for taking out a collector current difference of one transistor of each of said first and second multipliers;

two resistances connected in series and having one end coupled to an input terminal, a junction of said two resistances being connected to a base electrode of one of the first pair of differential transistors;

a condenser having one end connected to said input terminal and the other end connected to one of a collector electrode of the first multiplier; and a resistance externally provided at said voltage to current converter.

3. A voltage to current converter as claimed in claim 2, wherein said first voltage to current converting circuit includes a plurality of differential transistors having a first transistor and plural second transistors connected in parallel with each other, emitter electrodes of the first and second transistors being connected to each other through a first feedback resistance, and said second voltage to current converting circuit includes a plurality of a plurality of differential transistors having a third transistor and plural fourth transistors connected in parallel with each other, emitter electrodes of the third and fourth transistors being connected to each other through a second feedback resistance.

4. A voltage to current converter, comprising:

a first pair of differential transistors having first and second transistors whose emitter electrodes are connected to each other through a feedback resistance;

a second pair of differential transistors having third and fourth transistors whose emitter electrodes are connected to each other through a feedback resistance;

a first current source connected to the emitter electrode of said second transistor and a second current source connected to the emitter electrode of said fourth transistor;

a first multiplier including a first pair of diodes which are respectively supplied with collector currents of the first pair of differential transistors and a first pair of emitter-common differential transistors whose base electrodes are respectively given a potential difference of said first pair of diodes;

a second multiplier including a second pair of diodes which are respectively supplied with collector currents of said second pair of differential transistors and a second pair of emitter-common differential transistors whose base electrodes are respectively given a potential difference of the second pair of diodes; and a current-mirror circuit for taking out a collector current difference of one transistor of each of said first and second multipliers.

5. A voltage to current converter as claimed in claim 4, wherein said first pair of differential transistors operate in response to an input level larger than a predetermined level and said second pair of differential transistors operate in response to the input level equal to or less than said predetermined level.

6. A voltage to current converter as claimed in claim 4, further comprising:

two resistances connected in series and having a junction coupled to an output terminal therebetween;

a current source connected to one end of said resistances connected in series; and an emitter follower transistor whose emitter electrode is connected to the other end of said resistances connected in series, a base electrode of one of said first pair of differential transistors being connected to a junction between said current source and said one end of the resistances connected in series, and a base electrode of one of said second pair of differential transistors being connected to a junction between the emitter electrode of said emitter follower transistor and said the other end of said resistances connected in series.

7. An active filter using a voltage to current converter, which comprises:

a first pair of differential transistors having first and second transistors whose emitter electrodes are connected to each other through a feedback resistance;

a second pair of differential transistors having third and fourth transistors whose emitter electrodes are connected to each other through a feedback resistance;

a first current source connected to the emitter electrode of said second transistor and a second current source connected to the emitter electrode of said fourth transistor;

a first multiplier including a first pair of diodes which are respectively supplied with collector currents of the first pair of differential transistors and a first pair of emitter-common differential transistors whose base electrodes are respectively given a potential difference of said first pair of diodes;

a second multiplier including a second pair of diodes which are respectively supplied with collector currents of said second pair of differential transistors and a second pair of emitter-common differential transistors whose base electrodes are respectively given a potential difference of the second pair of diodes;

a current-mirror circuit for taking out a collector current difference of one transistor of each of said first and second multipliers;

two resistances connected in series and having one end coupled to an input terminal, a junction of said two resistances being connected to a base electrode of one of the first pair of differential transistors;

a condenser having one end connected to said input terminal and the other end connected to one of a collector electrode of the first multiplier; and a resistance externally provided at said voltage to current converter.

* * * * *